(12) United States Patent
Nakano et al.

(10) Patent No.: US 7,531,425 B2
(45) Date of Patent: May 12, 2009

(54) METHOD OF FABRICATING BONDED WAFER

(75) Inventors: Masatake Nakano, Annaka (JP); Shinichi Tomizawa, Annaka (JP); Kiyoshi Mitani, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 441 days.

(21) Appl. No.: 10/495,102

(22) PCT Filed: Nov. 19, 2002

(86) PCT No.: PCT/JP02/12039

§ 371 (c)(1),
(2), (4) Date: May 10, 2004

(87) PCT Pub. No.: WO03/046994

PCT Pub. Date: Jun. 5, 2003

(65) Prior Publication Data

US 2005/0020030 A1    Jan. 27, 2005

(30) Foreign Application Priority Data

Nov. 27, 2001  (JP) ............................ 2001-360267

(51) Int. Cl.
*H01L 21/30* (2006.01)
(52) U.S. Cl. ................ 438/455; 438/459; 438/E21.122
(58) Field of Classification Search ................ 438/455, 438/459, 977, 978, 753, E21.122; 257/E21.122
See application file for complete search history.

(56) References Cited

U.S. PATENT DOCUMENTS

| 5,899,731 | A | 5/1999 | Kai et al. |
| 6,239,039 | B1 | 5/2001 | Nihonmatsu et al. |
| 6,346,485 | B1 | 2/2002 | Nihonmatsu et al. |
| 6,432,837 | B2 | 8/2002 | Nihonmatsu et al. |
| 6,583,029 | B2 | 6/2003 | Abe et al. |
| 2001/0008807 | A1 | 7/2001 | Nihonmatsu et al. |

FOREIGN PATENT DOCUMENTS

| EP | 0 928 017 A2 | 7/1999 |
| EP | 1 134 808 A1 | 9/2001 |
| EP | 1 189 266 A1 | 3/2002 |
| JP | 04-226031 A | 8/1992 |
| JP | A 5-47617 | 2/1993 |
| JP | A 6-236867 | 8/1994 |
| JP | A 11-26337 | 1/1999 |
| JP | A 11-233485 | 8/1999 |

(Continued)

*Primary Examiner*—Eugene Lee
(74) *Attorney, Agent, or Firm*—Oliff & Berridge, PLC

(57) ABSTRACT

This invention relates to a method of fabricating a bonded wafer 39 in which a bond wafer 31 and a base wafer 32, both of which are composed of silicon single crystal, are bonded while placing an oxide film 33 in between, and the bond wafer 31 is thinned. Use of modified chemically-etched wafers as both of the bond wafer 31 and base wafer 32 is successful in reducing an unbonded area UA therebetween after annealing for bonding, where the modified chemically-etched wafer refers to a wafer which is etched by alkali etching and succeeding acid etching, while setting etching amount larger in the alkali etching than in the acid etching.

2 Claims, 2 Drawing Sheets

FOREIGN PATENT DOCUMENTS

| | | |
|---|---|---|
| JP | A 11-251277 | 9/1999 |
| JP | A 11-297666 | 10/1999 |
| JP | 2000-349265 A | 12/2000 |
| JP | A 2001-85648 | 3/2001 |
| JP | 2001-094080 A | 4/2001 |
| JP | A 2001-284559 | 10/2001 |
| JP | A 2001-345435 | 12/2001 |
| WO | WO 01/73831 A1 | 10/2001 |

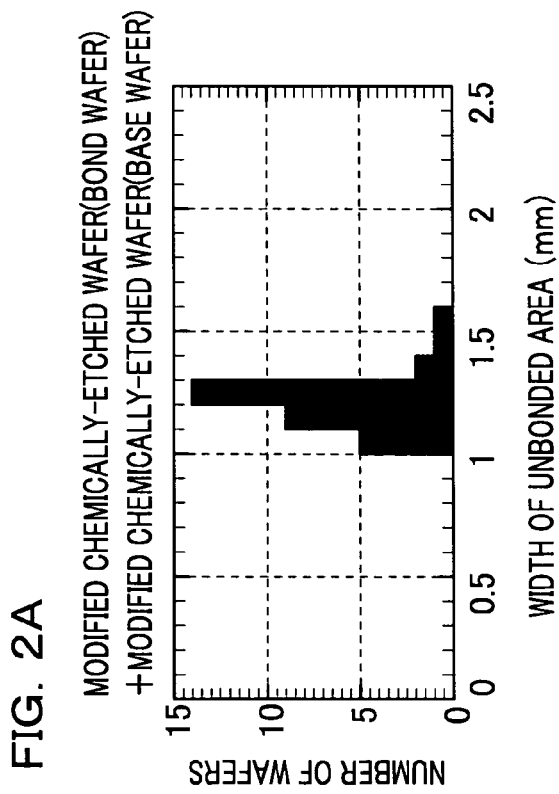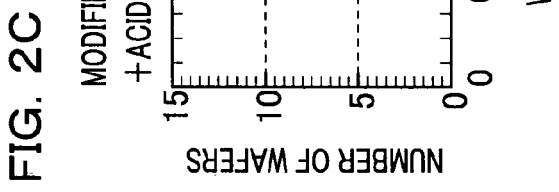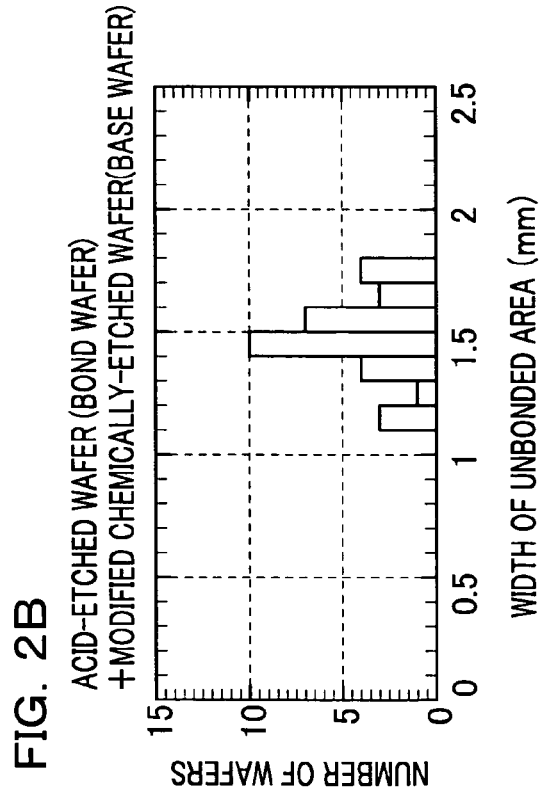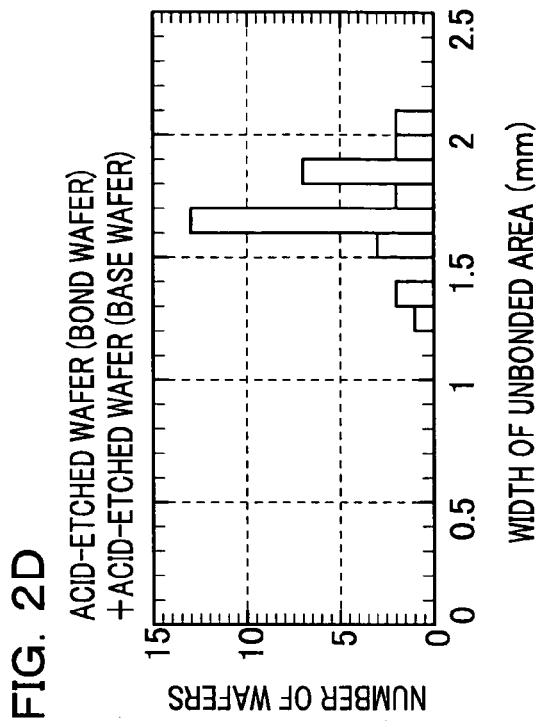

METHOD OF FABRICATING BONDED WAFER

TECHNICAL FIELD

This invention relates to a method of fabricating a bonded wafer.

BACKGROUND ART

In the field of mobile communication represented by cellular phone, it is becoming standard to handle a high-frequency signal of several-hundred MHz or above, and this inevitably requires a semiconductor device excellent in high-frequency characteristics. Semiconductor devices such as CMOS-IC or high-voltage-resistant IC, for example, use so-called SOI (Silicon on Insulator) wafer fabricated by forming a silicon oxide insulating layer on a silicon single crystal substrate (base wafer), and another silicon single crystal layer is stacked thereon as an SOI layer.

One known popular method of fabricating the SOI wafer is the bonding method. In the bonding method, a first silicon single crystal substrate as a base wafer, and a second silicon single crystal substrate (bond wafer) which configures an SOI layer in which devices will be formed, are bonded so as to oppose their mirror-polished surfaces while placing a silicon oxide film in between, and the bond wafer is then thinned to a predetermined thickness so as to make it into the SOI layer. Known methods for thinning the bond wafer include a method of grinding or polishing the back surface of the bond wafer after bonding, and a method of preliminarily implanting hydrogen ion or the like into the bond wafer and a portion thereof is delaminated after the bonding (ion implantation delamination method).

In the bonding step, the bond wafer and the base wafer in a stacked state are annealed so as to promote bonding. In this process, it is general that the outer circumferential portion of the wafer remains to some degree as an unbonded area due to polishing sag caused on the outer circumferential portion of the mirror-polished portion. The unbonded area is preferably as small as possible because it is a dead portion which cannot be used for producing final products. Several methods of reducing the unbonded area through improving accuracy in chamfering of the wafer are, however, still insufficient in the reducing effect, and further reduction even in a minimum degree is still a matter of large expectation.

This invention is conceived after considering the above-described demand, and a subject of which resides in reducing the unbonded area between the bond wafer and the base wafer in fabrication of a bonded wafer.

DISCLOSURE OF THE INVENTION

In view of solving the above-described subject, a method of fabricating a bonded wafer is such as bonding a bond wafer and a base wafer, both of which being composed of silicon single crystal, while placing an insulating layer in between or directly, and the bond wafer is thinned; wherein the bond wafer and base wafer used herein are such as those fabricated by the steps of slicing of a silicon single crystal ingot, chamfering, lapping, etching, mirror-polishing, and cleaning, and the etching step includes alkali etching and succeeding acid etching, while setting etching amount larger in the alkali etching than in the acid etching.

In fabrication of the mirror-polished wafers to be bonded, individual steps of slicing of a silicon single crystal ingot, chamfering, lapping, etching, mirror-polishing and cleaning may be partially altered in order, may be repeated a plural number of times, and may be added with or replaced by other processes such as annealing, grinding and so forth.

For the case where the wafer is fabricated by thinning the bond wafer through grinding or polishing, the base wafer to be bonded is generally a wafer which is mirror-polished after being etched using an alkaline etching solution. This is because the uniformity in film thickness in the process of thinning the bond wafer into a film by grinding or polishing depends on the flatness of the base wafer, and the alkali-etched wafer is superior to an acid-etched wafer if only the flatness is taken into account. On the contrary, the alkali etching has a large anisotropy in the etching rate, and tends to locally produce deep pits to thereby sharpen the surface irregularity. The deep pits and sharpened irregularity on the surface are causative of particle generation and contamination. It is also disadvantageous that the mirror-polishing of the chamfered portion by the alkali etching demands larger load of the relevant apparatus as compared with the case based on acid etching. As described in the above, some disadvantages reside in the alkali-etched wafer.

On the other hand, uniformity in film thickness in the process of thinning of the bond wafer by the ion implantation delamination method depends on accuracy of depth of ion implantation, but is scarcely affected by the flatness of the base wafer. The ion implantation delamination method is also advantageous in achieving thinning of as thin as, or more than $0.1\pm0.01$ µm and an excellent uniformity in the film thickness, which level cannot be achieved by the aforementioned grinding and polishing, so that it is successfully adopted to fabrication of a bonded wafer for the next generation. A problem of particle generation will more be anticipated in fabrication of a state-of-the-art device using the bonded wafer having a high-precision thin film of this level. In the conventional fabrication of the bonded wafer by the ion implantation delamination method, a wafer acid-etched in a small amount of particle generation and mirror-polished on the chamfered portion has preferably been used at least as a base wafer.

The inventors, however, recently succeeded in fabricating a modified chemically-etched wafer which can retain an excellent flatness of the alkali-etched wafer and suppressed pit generation, by combining the alkali etching and acid etching under a specific condition, and disclosed the technique in Japanese Laid-Open Patent Publication No. 11-233485.

The inventors lately discovered that a bonded wafer obtained by bonding thus modified chemically-etched wafers was considerably reduced in the unbonded area as compared with that in the wafer (conventional product) obtained by bonding the acid-etched wafers, and this fact led us to complete this invention. The aforementioned modified chemically-etched wafer is originally intended for achieving an advanced level of flatness of the wafer. That is, the inventors obtained a new finding that this type of bonded wafer is successful in reducing the unbonded area. The bonded wafer can readily be fabricated without considering everything about to what extent the chamfering margin or polishing margin should be determined.

More specifically, this invention is successful in reducing the unbonded area by approximately 0.5 mm in average in the radial direction as compared with the case where the acid-etched wafers are mutually bonded. Only by 0.5 mm might be, there is no reason to despise it. Considering now the case where devices are fabricated in a bonded SOI wafer. Because the devices are fabricated in every area of a predetermined size, only a slight running-out from the SOI layer will make the area incapable of yielding the product. This consequently reduces the number of devices obtainable from a single slice of wafer. It may be safely said that reduction in the unbonded area by a width even as small as 0.1 mm may be meaningful, and that reduction by as large as 0.5 mm may therefore be of great significance.

The modified chemically-etched wafer is also advantageous in that it is well suppressed in the pit generation and surface sharpness, and that the etching time is no more longer than that required for the alkali-etched wafer.

The modified chemically-etched wafer is a wafer fabricated by alkali etching and succeeding acid etching. A special meaning of the modified chemical etching resides in that the etching amount is set larger in the alkali etching than in the acid etching. More specifically, the etching amount is preferably adjusted to 10 to 30 μm or around for the alkali etching, and 5 to 20 μm or around for the acid etching. It is to be understood that all specific values of the etching amount described in this invention represent total values of the etching amount on both surfaces of the wafer.

This invention preferably adopts the ion implantation delamination method (so-called Smart Cut Process: registered trademark) in which the bond wafer is bonded after being formed therein an ion-implanted layer, and is then heated so as to produce crack at the ion-implanted layer, to thereby enable thinning. Not only hydrogen, but also other light-weight elements such as those selected from rare gas and alkali metals are available for the ion implantation. It is well known that the ion implantation delamination method is successful in obtaining a bonded SOI wafer highly excellent in uniformity of the film thickness. The ion implantation delamination method as combined with this invention in which the modified chemically-etched wafers are mutually bonded is still more preferable in terms of providing a high-precision bonded SOI wafer having only an extremely small unbonded area.

In this invention, the unbonded area between the bond wafer and the base wafer is adjusted so as to have an average width of 1.3 mm or less from the outer circumference of the base wafer in the radial direction.

BRIEF DESCRIPTION OF THE DRAWINGS

FIG. 2A is a histogram showing results of an embodiment;

FIG. 2B is a histogram showing results of another embodiment based on a combination differed from FIG. 2A;

FIG. 2C is a histogram showing results of still another embodiment based on a combination differed from FIG. 2A and FIG. 2B; and FIG. 2D is a histogram showing results of still another embodiment based on a combination differed from FIG. 2A, FIG. 2B and FIG. 2C.

BEST MODES FOR CARRYING OUT THE INVENTION

Figure 1:
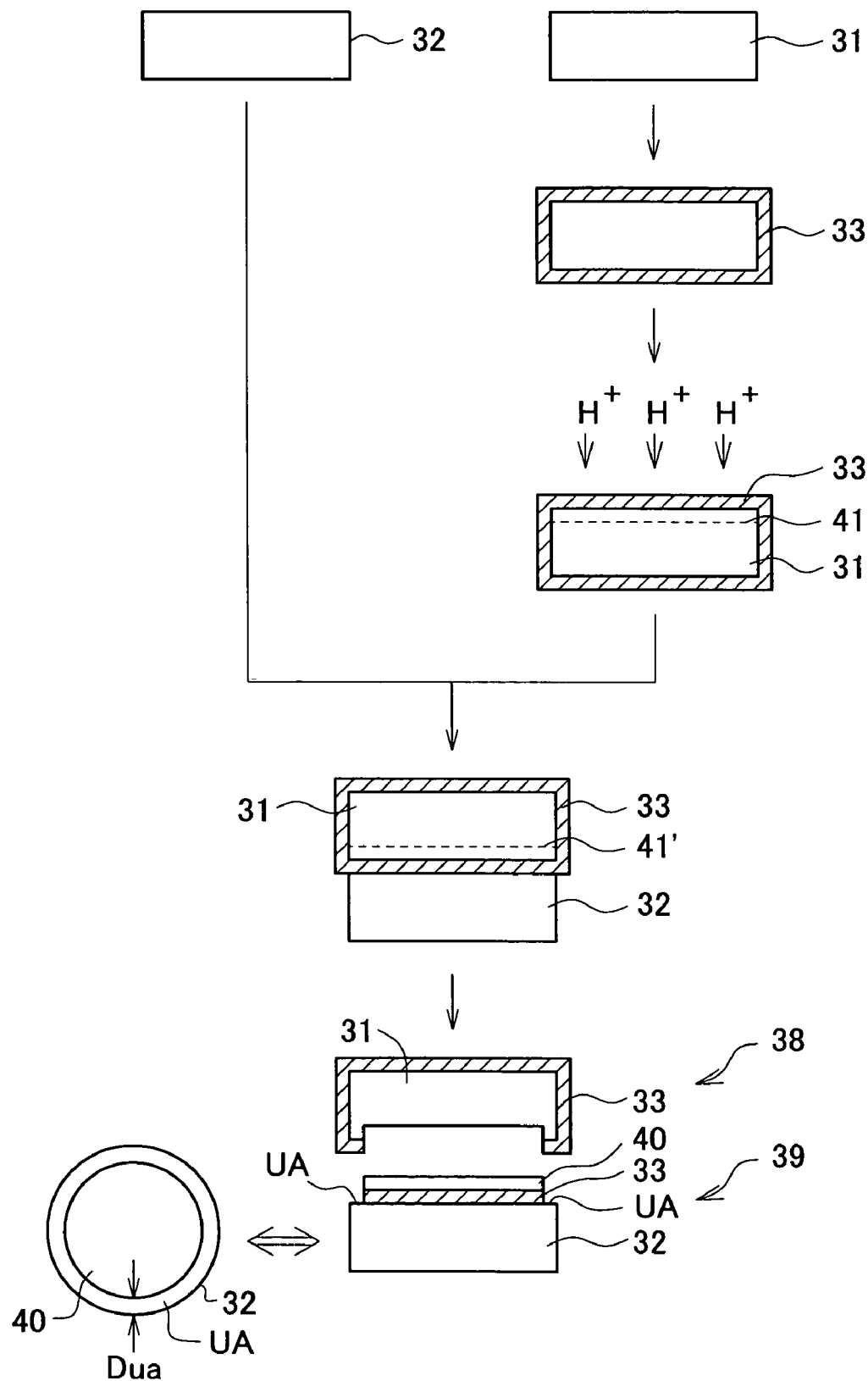
FIG. 1 is an explanatory drawing of a method of fabricating a bonded SOI wafer based on the ion implantation delamination method.

The following paragraphs will describe a method of fabricating a bonded wafer according to this invention.

First, a silicon single crystal ingot is fabricated according to any of publicly-known methods such as the FZ process and the CZ process. Thus-obtained single crystal ingot is then cut into blocks individually having a predetermined range of resistivity, and ground in the outer circumferential portion thereof. Each block after the outer circumferential grinding is then processed to form an orientation flat or an orientation notch. Thus-finished block is sliced typically by inner-blade sawing. Each silicon single crystal wafer after the slicing is then subjected to chamfering at the outer circumferential portion on both sides typically by beveling.

The wafer after the chamfering is then lapped on both sides thereof using free abrasive grain, so as to produce a lapped wafer. The lapped wafer is then chemically etched on both sides thereof by dipping it into an etching solution, so as to produce a chemically-etched wafer. The chemical etching process is carried out in order to remove any damaged layer produced in the surficial portion of the silicon single crystal wafer during the mechanical processing. The removal of the damaged layer by the chemical etching can be carried out using both of alkali etching and acid etching, where the former uses an aqueous sodium hydroxide solution or an aqueous potassium hydroxide solution, and the latter uses an aqueous mixed acid solution containing hydrofluoric acid, nitric acid and acetic acid.

For the case where a pit is formed due to the abrasive grain spiked into the wafer surface during the lapping process, the pit may grow into a deeper and wider local pit (typically of approximately 10 μm deep) by the alkali cleaning, succeeding to the lapping, for removing the abrasive grain. To avoid this nonconformity, both of the alkali etching and the acid etching are carried out in this order. In this procedures, the etching amount in the alkali etching is set larger than that in the acid etching. More specifically, the etching amount is preferably adjusted to 10 to 30 μm for the alkali etching, and 5 to 20 μm or around for the acid etching.

In the etching step, it is also preferable to dip the alkali-etched wafer into an aqueous hydrogen peroxide solution before the acid etching. This is because the surface of the wafer immediately after the alkali etching is activated and hydrophobic, and is very likely to catch foreign matters to thereby readily be contaminated, but dipping of the wafer into an aqueous hydrogen peroxide solution will oxidize the surface so as to have a hydrophilic nature, and this makes the surface less likely to catch the particles. Concentration of the aqueous hydrogen peroxide solution used herein is preferably adjusted to 0.1 to 30% by mass. A concentration less than 0.1% by mass may result in only an insufficient hydrophilicity of the wafer surface, and 30% by mass is effective enough, where any larger concentration beyond this limit may only result in an economical loss.

An aqueous sodium hydroxide solution or an aqueous potassium hydroxide solution can be used as the alkali etching solution, and an aqueous mixed acid solution containing hydrofluoric acid, nitric acid, acetic acid and water can be used as the acid etching solution. Such selection of the etching solutions can ensure desirable etching effects both in the alkali etching and acid etching, relatively easy control of the etching amount and low cost.

It is preferable to dissolve 20 to 30 g/ of silicon into the aqueous mixed acid solution used for the acid etching. The acid etching solution having silicon dissolved therein can be referred to as reaction-controlled acid etching solution because the reaction is controlled by reaction rate, in contrast to the ordinary silicon-free acid etching solution which shows reaction rate controlled by diffusion rate. In the process of carrying out the reaction-controlled acid etching after the alkali etching, a mechanical strain layer is first removed by the alkali etching while keeping a flatness of the wafer attained by the lapping unchanged, and a succeeding reaction-controlled acid etching can successfully smoothen the local deep pit and sharp irregularity remained on the wafer surface after the alkali etching, to thereby improve the surface roughness, suppress a ratio of stain generation, and suppress the waviness as compared with the diffusion-controlled acid etching.

According to the above-described, two-step chemical etching composed of the alkali etching and acid etching, the mechanical strain layer is first removed by the alkali etching while keeping a flatness after the lapping unchanged, and any local deep pit and sharp irregularity remained on the wafer surface after the alkali etching can be smoothened by the succeeding acid etching, to thereby improve the surface roughness and suppress the ratio of stain generation.

Proper adjustment of etching conditions ensures stable manufacture of the wafer typically having a flatness expressed by TTV (total thickness variation) of 1 μm or less, expressed by $LTV_{max}$ (local thickness variation) in a 20×20 mm cell of 0.3 μm or less, and a maximum depth of pit of 6 μm or less. The wafer satisfying these requirements can be referred to as the modified chemically-etched wafer. Such wafer is also excellent in terms of flatness over a wide area, showing an average waviness of as small as 0.04 μm.

It is to be noted that TTV (μm) is a value expressing difference between thickness values obtained from the thickest portion and thinnest portion of one wafer, and gives an index for evaluating flatness of the wafer. LTV (μm) is a value expressing difference between thickness values obtained from the thickest portion and thinnest portion of the individual cells assumed on one wafer by dividing its area into 20×20 mm or 25×25 mm squares in general, where LTV of the individual cells is referred to as $LTV_{cbc}$, and the maximum LTV in one wafer is referred to as $LTV_{max}$, which serves as an index for wafer flatness. The waviness is measured, for an exemplary case of a 200 mm wafer, first by tracing a central area of the wafer for 60 mm with a contact probe so as to obtain only shape component exclusive of any fine surface roughness components. Heights of the measurement start point and the measurement end point are then equalized to thereby define a referential level of height, absolute values of displacement from the referential level are measured at 2 mm intervals, and an average value of these values can be defined as the waviness.

After the chemical etching as described in the above, the mirror-polishing will be carried out. In a specific process, the wafer supported on a polishing head is pressed under a predetermined pressure against a rotary polishing table having a polishing cloth attached thereon. The polishing table is rotated while supplying a polishing liquid such as alkaline colloidal silica mainly composed of $SiO_2$ into a polishing cloth, so as to effect polishing. The polishing proceeded herein is so-called mechano-chemical polishing based on a composite effect of mechanical polishing using an abrasive grain such as colloidal silica and chemical etching contributed by an alkaline solution. The mirror-polishing is preferably effected only on one side of the wafer in view of easiness in the wafer handling.

It is also allowable in the method of this invention to carry out, after the chemical etching step, the mirror-polishing of at least the chamfered portion of the base wafer. In other words, the base wafer 32 after the chemical etching step may be mirror-processed (mirror-polished) at the chamfered portion thereof if necessary. The base wafer 32 after the chemical etching step (alkali etching step+acid etching step) of this invention has smoothened surface irregularity in the chamfered portion, and this successfully raises efficiency in the mirror-polishing of the chamfered portion.

More specifically, assuming now that the time required for the mirror-polishing (mirror chamfering polishing) of the chamfered portion of the wafer after processed only by the general acid etching as 1, the present inventors confirmed that the wafer after processed only by the alkali etching needed the mirror-polishing time of 2 or longer, and sometimes even needed re-grinding of the chamfered portion of the etched wafer before mirror chamfering polishing, and also confirmed that the wafer processed by the above-described alkali etching as combined with acid etching required the mirror-polishing time of only as short as 1.1 to 1.3 or around, where the mirror-polishing was found to be effective only by an amount etching of approximately 1 μm to several μm, although an accurate measurement of the polishing amount was difficult.

The mirror processing of the chamfered portion may be provided not only to the base wafer 32, but also to the bond wafer 31. The mirror processing may be carried out in either timing of before or after the mirror-polishing of the main surfaces (bonding surfaces) of the individual wafers. It is still also allowable to carry out the mirror-polishing before the base wafer 32 is bonded to the bond wafer 31, or after the bonded wafer is fabricated.

Next, the bonding step will be explained. This embodiment adopts the aforementioned ion implantation delamination method (Smart Cut Process). As shown in FIG. 1, an oxide film 33 is formed on the modified chemically-etched wafer (bond wafer 31) already polished on one surface thereof, by a publicly-known thermal oxidation method or CVD process. The bond wafer 31 having the oxide film 33 formed thereon is then implanted with hydrogen ion from the main surface on the bonding side, to thereby form an ion implanted layer 41. The main surface on the bonding side herein is a mirror-polished surface. It is also allowable to form the oxide film 33 on the base wafer 31, or on both wafers.

Next, the bond wafer 31 having the ion implanted layer 41 formed therein and the base wafer 32 on which an SOI layer 40 will be formed later are closely contacted while placing the oxide film 33 in between, and then annealed. The annealing causes a crack at the ion implanted layer 41 so as to produce a delamination layer 41', and the bond wafer 31 is delaminated so as to leave only the surficial portion of the main surface on the bonding side as the SOI layer 40, which is bonded to the base wafer 32 to produce an SOI wafer 39. It is also allowable herein to extremely raise the dose of ion implantation or subject the bonding surface to plasma treatment, to thereby omit the annealing for delamination.

The separation of a residual wafer 38, which is a residue of the bond wafer 31, and the SOI wafer 39 can be assisted by a vacuum chuck, in which the residual wafer 38 or the SOI wafer 39 can be chucked from the back surface side thereof and recovered. The SOI wafer 39 after the recovery is then subjected to touch polishing (polishing in an extremely small amount of removal) and high-temperature annealing so as to remove any damaged layer or to improve the surface roughness, and thereby a high-quality bonded SOI wafer can be obtained.

EXAMPLE

First, a 200 mm-diameter lapped wafer (abrasive grain for lapping: #1200) fabricated as described in the above was subjected to the etching described below. The lapped wafer used herein was preliminarily polished in the chamfered portion thereof using an abrasive grain of #1500. First, the alkali etching was carried out, setting a target etching amount of 20 μm, by immersing the lapped wafer in a 50 wt.% aqueous sodium hydroxide solution at 85° C. for 450 seconds. Next, the wafer was hydrophilized by immersing it into a 0.3 wt.% aqueous hydrogen peroxide solution, and the acid etching was then carried out, setting a target etching amount of 10 μm, using a mixed acid solution prepared by mixing a commercial 50% hydrofluoric acid, 70% nitric acid and 99% acetic acid in a ratio by volume of 1:2:1. The obtained wafer was measured for the flatness (TTV, $LTV_{max}$) and depth of pit, and after confirming that the individual values successfully fell within the above-described ranges, the wafer, now assumed as the modified chemically-etched wafer, was mirror-polished on the surface (the surface on the bonding side) thereof from the side opposite to that subjected to the measurement, to thereby fabricate the bond wafer 31 and base wafer 32 for bonding. The base wafer 32 was further subjected to mirror-polishing in its chamfered portion.

Next, in order to fabricate the bonded SOI wafer 39 by the aforementioned ion implantation delamination method, the bond wafer 31 was annealed in an oxidative atmosphere to thereby form the thermal oxide film 33 of approximately 150 nm thick. Then hydrogen ion $H^+$ was implanted from the main surface to be bonded under an ion acceleration voltage of 56 keV, and a dose of $5.0 \times 10^{16}$ $cm^{-2}$, to thereby form the ion implanted layer 41. The bond wafer 31 was then kept in close contact with the base wafer 32 to be bonded, and annealed at 500° C. for 30 minutes, taken out from the annealing furnace, and the SOI wafer 39 and the residual wafer 38 were separated to thereby obtain the bonded SOI wafer 39.

Thus obtained bonded SOI wafer 39 was measured for the width $D_{ua}$ in the radial direction of the unbonded area UA. Results were shown in FIG. 2A. Total number of samples of the SOI wafer 39 was 32 (the same will apply also to the Comparative Example described later). FIGS. 2A to 2D are histograms having the width $D_{ua}$ of the unbonded area UA of the individual samples plotted on the abscissa, and the frequency (number of samples) plotted on the ordinate. From the results, an average value of the width $D_{ua}$ of the unbonded area UA was found to be 1.26 mm.

Comparative Example

Next, the general chemically-etched wafers (acid-etched wafers) which were processed only by the acid etching with an etching amount of 30 μm were fabricated. Three types of bonded SOI wafers were then fabricated using these acid-etched wafers and the modified chemically-etched wafer used in the Example in different combination. Conditions for the bonding or so were same as those described in the Example above. Results were shown in FIGS. 2B to 2D. The combination of the wafers are as listed below:

FIG. 2B . . . acid-etched wafer (bond wafer)+modified chemically-etched wafer (base wafer);

FIG. 2C . . . modified chemically-etched wafer (bond wafer)+acid-etched wafer (base wafer); and FIG. 2D . . . acid-etched wafer (bond wafer)+acid-etched wafer (base wafer).

Average values of the width $D_{ua}$ of the unbonded area UA for the individual combinations were found to be 1.55 mm for the combination shown in FIG. 2B, 1.60 mm for the combination shown in FIG. 2C, and 1.75 mm for the combination shown in FIG. 2D.

As is obvious from the above, the method of fabricating the SOI wafer by mutually bonding the modified chemically-etched wafers was successful in reducing the width $D_{ua}$ of the unbonded area UA by approximately 0.5 mm as compared with that of the conventional SOI wafer fabricated by mutually bonding the acid-etched wafers. The modified chemically-etched wafer was effective even when used for either one of the wafers. It is to be understood that also 300 mm wafer will of course be successful in obtaining the same effect, although the above-described Example only dealt with the 200 mm wafer.

What is claimed is:

1. A method of fabricating a bonded wafer from a base wafer and a bond wafer, comprising:
   fabricating a base wafer and a bond wafer by slicing a silicon single crystal ingot, chamfering, lapping, alkali etching and then acid etching, the etching being controlled to produce an etching amount larger in the alkali etching than in the acid etching, mirror-polishing and cleaning each wafer;
   forming an ion-implanted layer in the bond wafer;
   inserting an insulating layer between the base wafer and the bond wafer;
   bonding the bond wafer, the insulating layer and the base wafer together such that an unbonded area between the bond wafer and the base wafer is limited to have an average width of 1.3 mm or less and a maximum width of 1.6 mm from the outer circumference of the base wafer in the radial direction after forming the ion-implanted layer;
   heating the bond wafer to produce a crack at the ion-implanted layer to enable thinning of the bond wafer; and
   thinning the bond wafer.

2. The method of fabricating the bonded wafer as claimed in claim 1, further comprising a step of mirror-polishing at least the chamfered portion of the base wafer, after the etching step.

* * * * *